(12) United States Patent
Dani

(10) Patent No.: US 12,088,254 B2
(45) Date of Patent: Sep. 10, 2024

(54) DOHERTY POWER AMPLIFIER WITH INTEGRATED SECOND HARMONIC INJECTION

(71) Applicant: Pivotal Commware, Inc., Bothell, WA (US)

(72) Inventor: Asmita Dani, Palo Alto, CA (US)

(73) Assignee: Pivotal Commware, Inc., Kirkland, WA (US)

( * ) Notice: Subject to any disclaimer, the term of this patent is extended or adjusted under 35 U.S.C. 154(b) by 520 days.

(21) Appl. No.: 17/222,371

(22) Filed: Apr. 5, 2021

(65) Prior Publication Data
US 2021/0226586 A1 Jul. 22, 2021

Related U.S. Application Data

(63) Continuation of application No. 16/407,108, filed on May 8, 2019, now Pat. No. 10,972,053.

(60) Provisional application No. 62/668,781, filed on May 8, 2018.

(51) Int. Cl.
*H03F 1/02* (2006.01)
*H03F 3/24* (2006.01)

(52) U.S. Cl.
CPC ......... *H03F 1/0288* (2013.01); *H03F 3/245* (2013.01); *H03F 2200/171* (2013.01); *H03F 2200/387* (2013.01); *H03F 2200/451* (2013.01); *H03F 2203/21106* (2013.01); *H03F 2203/21139* (2013.01); *H03F 2203/21142* (2013.01); *H03F 2203/21157* (2013.01)

(58) Field of Classification Search
CPC .................. H03F 1/0288; H03F 3/245; H03F 2200/171; H03F 2200/387; H03F 2200/451; H03F 2203/21106; H03F 2203/21139; H03F 2203/21142; H03F 2203/21157; H03F 1/32; H03F 1/56
USPC ......................................................... 330/295
See application file for complete search history.

(56) References Cited

U.S. PATENT DOCUMENTS

| 9,537,198 B2 * | 1/2017 | Seneviratne .......... H03F 1/0288 |
| 2015/0123734 A1 * | 5/2015 | Donati ..................... H03F 3/245 330/295 |
| 2019/0312552 A1 | 10/2019 | Chan et al. |

OTHER PUBLICATIONS

A. Alizadeh, et al., "Class-J2 Power Amplifiers," IEEE Transactions on Circuits and Systems-I: Regular Papers, vol. 64, No. 8, pp. 1989-2002, Aug. 2017.
F. H. Raab, et al., "Power amplifiers and transmitters for RF and microwave," IEEE Transactions on Microwave Theory and Techniques, vol. 50, No. 3, pp. 814-826, Mar. 2002.
P. Colantonio, et al., "The Doherty Power Amplifier," International Journal of Microwave and Optical Technology, vol. 5, No. 6, pp. 419-430, Nov. 2010.

(Continued)

*Primary Examiner* — Andrea Lindgren Baltzell
*Assistant Examiner* — Khiem D Nguyen
(74) *Attorney, Agent, or Firm* — PCFB, LLC; Justin K. Flanagan

(57) ABSTRACT

Examples disclosed herein relate to a Doherty Power Amplifier ("DPA") with integrated second harmonic injection. The DPA includes an amplifier circuit having a carrier amplifier and a peaking amplifier, and a combiner network coupled to the amplifier circuit, the combiner network having a plurality of transmission lines and a LC resonant circuit to inject a second harmonic from the carrier amplifier into the peaking amplifier.

18 Claims, 5 Drawing Sheets

(56) References Cited

OTHER PUBLICATIONS

P. Colantonio, et al., "The AB-C of the Doherty PA," Course on High Efficiency Microwave Power Amplifier Design, Toulouse, France, Oct. 2007.

A. Atanaskovic, et al., "Power Amplifier Linearization by Modified Baseband Signal Injection," 12th International Conference on Telecommunication in Modern Satellite, Cable and Broadcasting Services (TELSIKS), pp. 102-105, Oct. 2015.

A. Atanaskovic, et al., "The Linearization of Doherty Amplifier," Microwave Review, vol. 14, No. 1, pp. 25-34, Sep. 2008.

A. Atanaskovic, et al., "The linearization of high-efficiency three-way Doherty Amplifier," 16th Telecommunications forum (TELFOR), pp. 25-27, Nov. 2008.

A. Dani, et al., "Linearization of Efficient Harmonically-Injected PAs," IEEE Topical Conference on Power Amplifiers for Wireless and Radio Applications (PAWR), pp. 31-33, Jan. 2013.

A. Dani, et al., "Efficient Linear Supply-Modulated PA with Harmonic Injection," Proceedings of the 43rd European Microwave Conference, pp. 541-544, Oct. 2013.

A. Dani, et al., "4W X-Band High Efficiency MMIC PA with Output Harmonic Injection," Proceedings of the 9th European Microwave Integrated Circuits Conference, pp. 389-392, Oct. 2014.

A. Dani, et al., "PA Efficiency and Linearity Enhancement Using External Harmonic Injection," IEEE Transactions on Microwave Theory and Techniques, vol. 60, No. 12, pp. 4097-4106, Dec. 2012.

A. Doric, et. al., "Linearization and Efficiency Enhancement of the RF Power Amplifier by the Even-Order Nonlinear Signal Injection," 12th International Conference on Telecommunication in Modern Satellite, Cable, and Broadcasting Services (TELSIKS), pp. 106-109, Oct. 2015.

A. M. M. Mohamed, et. al, "Reconfigurable Doherty Power Amplifier for Multifrequency Wireless Radio Systems," IEEE Transactions on Microwave Theory and Techniques, vol. 61, No. 4, pp. 1588-1598, Apr. 2013.

A. Atanaskovic, et al., "Linearization of Two-Way Doherty Amplifier," Proceedings of the 6th European Microwave Integrated Circuits Conference, pp. 304-307, Oct. 2011.

B. Kim, et. al, "Advanced Doherty Architecture," IEEE Microwave Magazine, vol. 11, No. 5, pp. 72-86, Aug. 2010.

C. Aitchison, et al., "Improvement of Third-Order Intermodulation Product of RF and Microwave Amplifiers by Injection," IEEE Transactions on Microwave Theory and Techniques, vol. 49, No. 6, pp. 1148-1154, Jun. 2001.

D. Holmes, et al., "WSK: Tutorial on Doherty Power Amplifier Circuits & Design Methodologies," IEEE International Microwave Symposium, pp. 1-121, Jun. 2013.

D. Holmes, et al., "WSK: Tutorial on Doherty Power Amplifier Circuits & Design Methodologies, Simulation Laboratory Exercise," International Microwave Symposium, pp. 1-66, Jun. 2013.

J. Son, et al., "A Highly Efficient Asymmetric Doherty Power Amplifier with a New Output Combining Circuit," IEEE International Conference on Microwaves, Communications, Antennas, and Electronic Systems (COMCAS), pp. 1-4, Nov. 2011.

L. Piazzon, et al., "A Method for Designing Broadband Doherty Power Amplifiers," Progress In Electromagnetics Research, vol. 145, pp. 319-331, 2014.

P. Colantonio, et al., "The AB-C of the Doherty Power Amplifier. part I: Theory," International Journal of RF and Microwave Computer-Aid Engineering, vol. 19, No. 3, pp. 293-306, May 2009.

P. Colantonio, et al., "The AB-C Doherty power amplifier. Part II: Validation," International Journal of RF and Microwave Computer-Aided Engineering, vol. 19, No. 3, pp. 307-316, May 2009.

R. Giofre, et al., "New Output Combiner for Doherty Amplifiers," IEEE Microwave and Wireless Components Letters, vol. 23, No. 1, pp. 31-33, Jan. 2013.

R. Pengelly, et al., "Doherty's Legacy: A History of the Doherty Power Amplifier from 1936 to the Present Day," IEEE Microwave Magazine, vol. 17, No. 2, pp. 41-58, Feb. 2016.

S. Jee, et al., "GaN MMIC Broadband Doherty Power Amplifier," Asia-Pacific Microwave Conference Proceedings (APMC), pp. 603-605, Nov. 2013.

S. Nishiki, et al., "Harmonic Reaction Amplifier—A Novel High-Efficiency and High-Power Microwave Amplifier," IEEE MTT-S International Microwave Symposium Digest, pp. 963-966, Jun. 1987.

X. Y. Zhou, et al., "Postmatching Doherty Power Amplifier With Extended Back-Off Range Based on Self-Generated Harmonic Injection," IEEE Transactions on Microwave Theory and Techniques, vol. 66, No. 4, pp. 1951-1963, Apr. 2018.

Y. Yang, et al., "A Fully Matched N-Way Doherty Amplifier with Optimized Linearity," IEEE Transactions on Microwave Theory and Techniques, vol. 51, No. 3, pp. 986-993, Mar. 2003.

\* cited by examiner

DOHERTY POWER AMPLIFIER WITH INTEGRATED SECOND HARMONIC INJECTION

CROSS-REFERENCE TO RELATED APPLICATIONS

This application claims priority to U.S. Application Ser. No. 16/407,108, filed on May 8, 2019, which claims priority to U.S. Provisional Application No. 62/668,781, filed on May 8, 2018, and are both incorporated herein by reference in their entirety.

BACKGROUND

New generation wireless networks are increasingly becoming a necessity to accommodate user demands. Mobile data traffic continues to grow every year, challenging the wireless networks to provide greater speed, connect more devices, have lower latency, and transmit more and more data at once. Users now expect instant wireless connectivity regardless of the environment and circumstances, be it in an office building, a public space, an open preserve, or a vehicle. In response to these demands, a new wireless standard known as 5G has been designed for deployment in the near future. The 5G standard is expected to operate in the millimeter wave spectrum with high frequencies between 30 and 300 GHz. Successful deployment of millimeter wave 5G communications will depend on the successful design of electronic components that can handle the challenges imposed by the very short wavelengths, including free space loss, atmospheric absorption, power consumption, and component cost.

One of the critical components in 5G communication systems is a Power Amplifier ("PA"). Power amplifiers have been used in communication systems for many years and are now omnipresent in wireless transmitters. The Doherty PA ("DPA") in particular has gained significant traction in the market to become the de facto PA proposed for 5G communications. A DPA is characterized by its high efficiency, linearity and elegant circuit design. However, there are a number of challenges that need to be solved before DPAs are effective in millimeter wave 5G communications.

BRIEF DESCRIPTION OF THE DRAWINGS

The present application may be more fully appreciated in connection with the following detailed description taken in conjunction with the accompanying drawings, which are not drawn to scale and in which like reference characters refer to like parts throughout.

DETAILED DESCRIPTION

A DPA with integrated second (2nd) harmonic injection is disclosed. The harmonic injection is implemented in a novel combiner network to provide increased efficiency for the DPA at back-off. High efficiency is an important criterion in wireless communications as PAs usually consume a large fraction of the available power in the transmitter. PAs in wireless transmitters can be located behind a transmitter's antenna and often operate in a saturated regime in order to be more efficient. The primary challenge is to achieve high efficiency while maintaining linearity over the entire range of power levels and bandwidths. The DPA with integrated $2^{nd}$ harmonic injection disclosed herein achieves these goals while operating in millimeter wave applications, such as 5G wireless communications, fixed wireless, satellite communications, radar systems in autonomous driving vehicles, and many others.

It is appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

Figure 1:
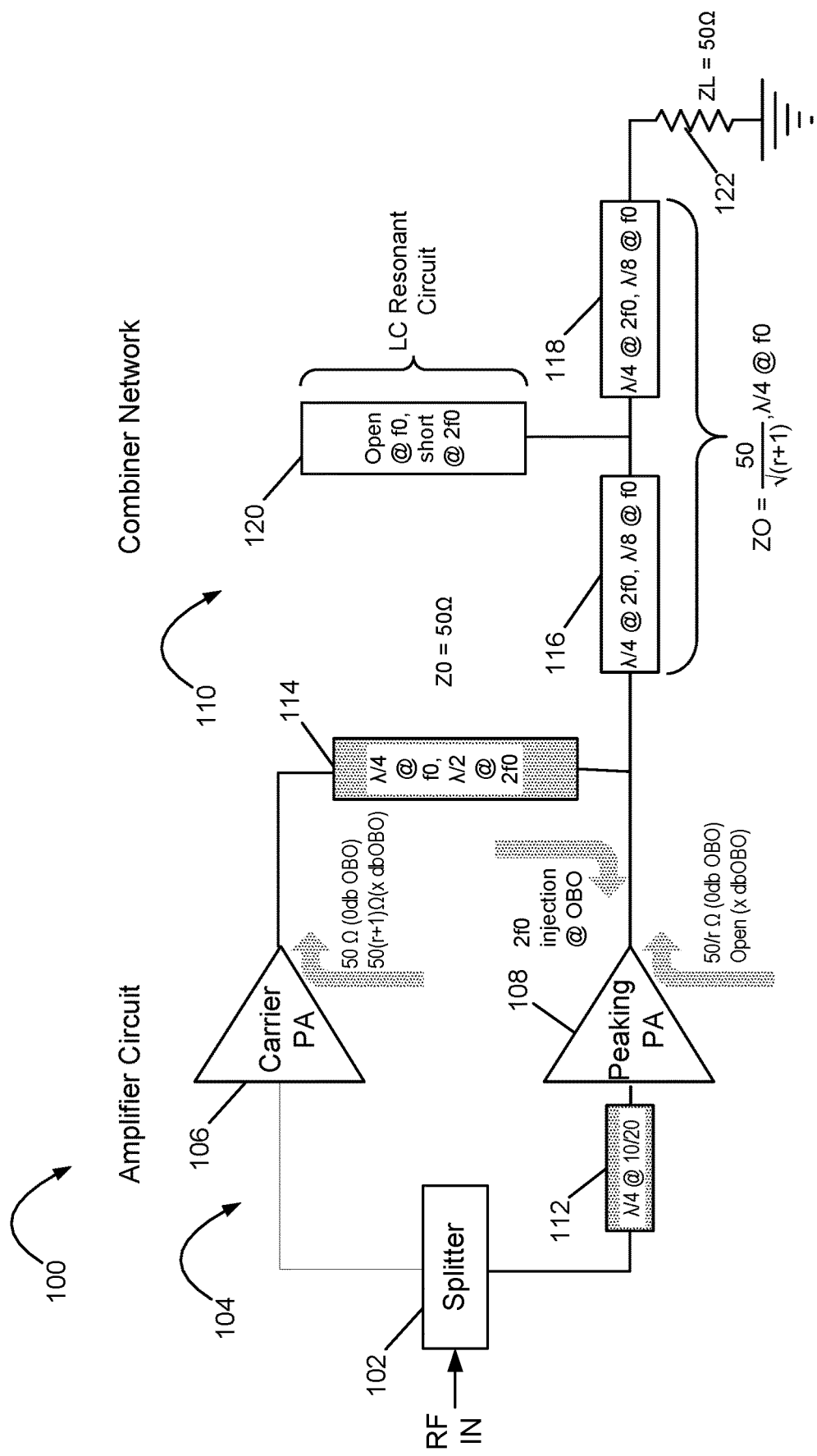
FIG. 1 is a schematic diagram of a Doherty Power Amplifier ("DPA") with an integrated $2^{nd}$ harmonic combiner network in accordance with various examples.

FIG. 1 illustrates a schematic diagram of a DPA with an integrated $2^{nd}$ harmonic combiner network in accordance with various examples. DPA 100 has splitter 102, amplifier circuit 104 with a carrier PA 106 and a peaking amplifier PA 108, and novel combiner network 110 coupled to the amplifier circuit 104. Splitter 102 takes an input RF signal and produces two signals that are 90° out of phase with each other. The splitter 102 performs a 3-dB power split, as half the power of the input signal goes to the carrier PA 106 and the other half goes to the peaking PA 108 via a quarter of a wavelength transmission line 112.

The carrier PA 106 normally operates in class A or AB and provides a gain at any power level. Carrier PA 106 is particularly aimed at carrying the average amplitude signal levels. The peaking PA 108 comes into play when the carrier PA 106 is getting towards its limits in saturation and is introducing non-linearities which can be used advantageously. The peaking PA 108 provides the extra power capability that the carrier PA 106 cannot provide on its own. The idea is to use the peaking PA 108 to "top up" the signal when the carrier PA 106 goes into saturation and is operating at its most efficient level.

In various examples, DPA 100 operates in the millimeter wave spectrum where electronic components intrinsically have a lower gain. Running the peaking PA 108 as a Class C amplifier as traditionally implemented in DPAs is therefore not an option due to the very low gain. Running the peaking PA 108 as a Class B or Class AB is also not desirable as the turn-on of the peaking PA 108 would be much sooner than desired, resulting in an even lower overall efficiency for DPA 100. This challenge can be resolved with the novel combiner network 110, which injects the $2^{nd}$ harmonic from the carrier PA 106 into the output of the peaking PA 108 at back-off. The $2^{nd}$ harmonic injection results in higher back-off efficiency for the peaking PA 108 and an overall higher efficiency for DPA 100.

The combiner network 110 includes a $\lambda/4$ transmission line section 114 and two $\lambda/8$ transmission line sections 116-118 in parallel with a LC resonant circuit 120. The LC resonant circuit 120 results in an open circuit at the fundamental frequency and in a short circuit at the $2^{nd}$ harmonic. The $\lambda/4$ transmission line section 114 ties the output of the carrier PA 106 to the output of the peaking PA 108 and the rest of the combiner network 110 and provides a 90° phase shift. When DPA 100 is running with a low input signal, the peaking PA 108 is mostly inactive and can be thought of as an open circuit. As the level of the input signal increases, the peaking PA 108 begins to conduct more, feeding current into combiner network 110. The carrier PA 106 has its load impedance drop as its RF input power increases. That is, the peaking PA 108 acts as a load puller to the carrier PA 106. Transmission line section 114 transforms the output impedance of carrier PA 106 to a higher value, allowing the peaking PA 108 transistor collectors to efficiently pump power into the load 122.

Each $\lambda/8$ transmission line section 116-118 is equivalent to a $\lambda/4$ transmission line at the $2^{nd}$ harmonic. The impedance looking out to the load 122 (e.g., a 50Ω load) at the $2^{nd}$ harmonic is therefore an open circuit. The $2^{nd}$ harmonic signal coming from the carrier PA 106 is only injected at the output of the peaking PA 108, while being completely isolated from the load 122. As a result, the fundamental characteristics of a Doherty combiner network are preserved at the fundamental frequency while an additional capability is introduced with the $2^{nd}$ harmonic injection at the peaking PA 108 to increase its overall efficiency.

It is appreciated that the concept of harmonic injection refers to circuits in which power at one or more harmonics of the operating or fundamental frequency is supplied externally to either the input, output or both of an active device. All of the nonlinear classes of PAs generate harmonics. The harmonics must be properly terminated to prevent power from escaping the amplifier at frequencies other than the fundamental frequency. The harmonics must also be terminated at the proper phase, or the amplifier cannot operate at its maximum efficiency. The $2^{nd}$ harmonic injection introduced with the novel combiner network 110 accomplishes this harmonic termination while enabling DPA 100 to achieve high efficiency and linearity.

Figure 2:
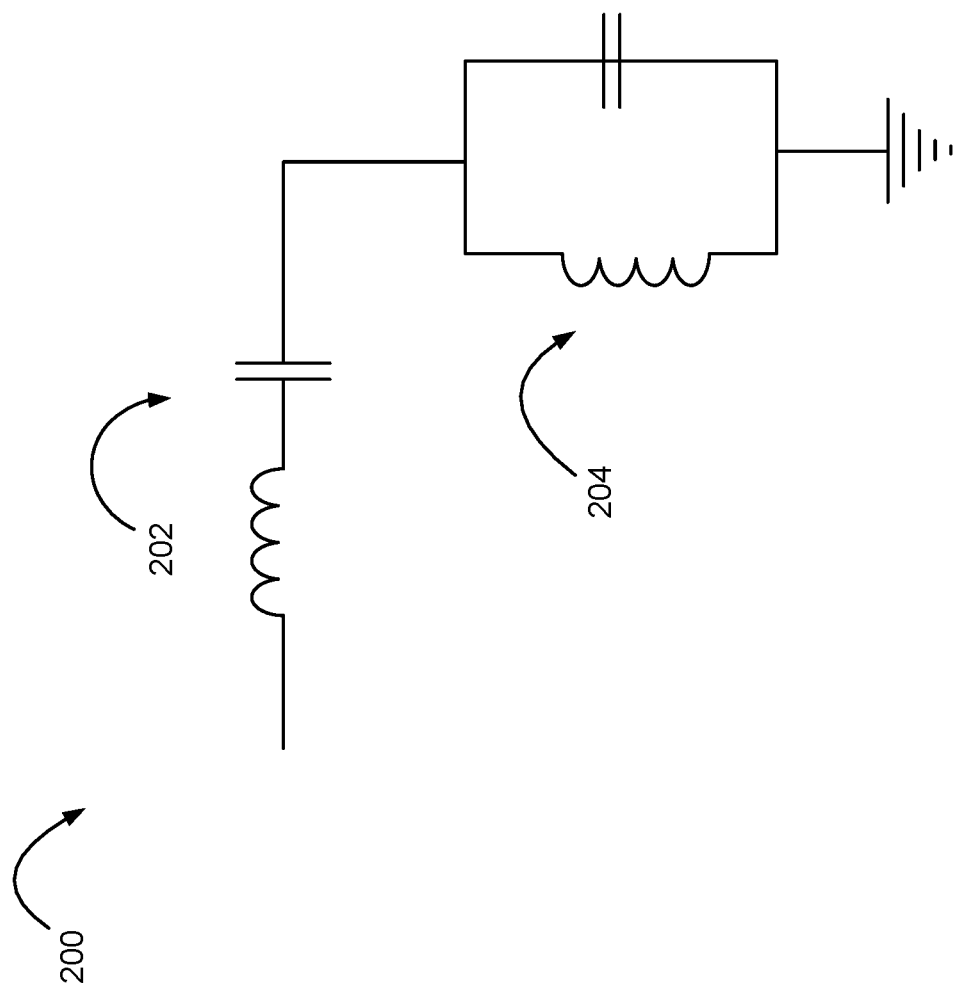
FIG. 2 is an example schematic diagram of a LC resonant circuit for use with the DPA of FIG. 1.
Figure 3:
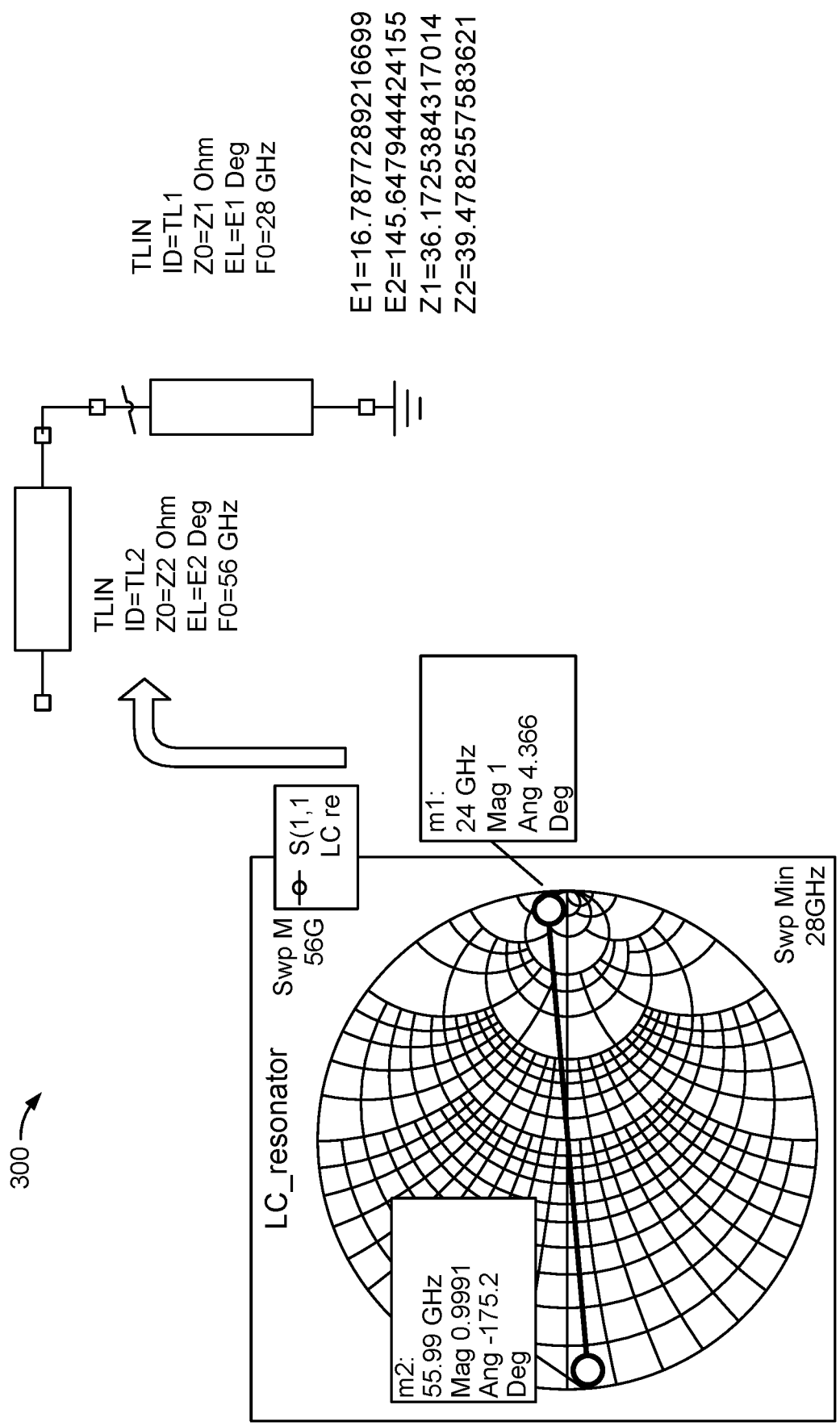
FIG. 3 illustrates a transmission line model for the LC resonant circuit of FIG. 2.

The goal of the LC resonant circuit 120 is therefore to provide a filter response of a very high impedance (ideal open) at the fundamental frequency and very low impedance (ideal short) at the $2^{nd}$ harmonic. An example LC resonant circuit for use with the DPA of FIG. 1 is shown in FIG. 2. LC resonant circuit 200 accomplishes this goal by combining series and parallel LC resonant circuits 202 and 204 and synthesizing a transmission line model 300 shown in FIG. 3 to achieve the desired response.

Figure 4:
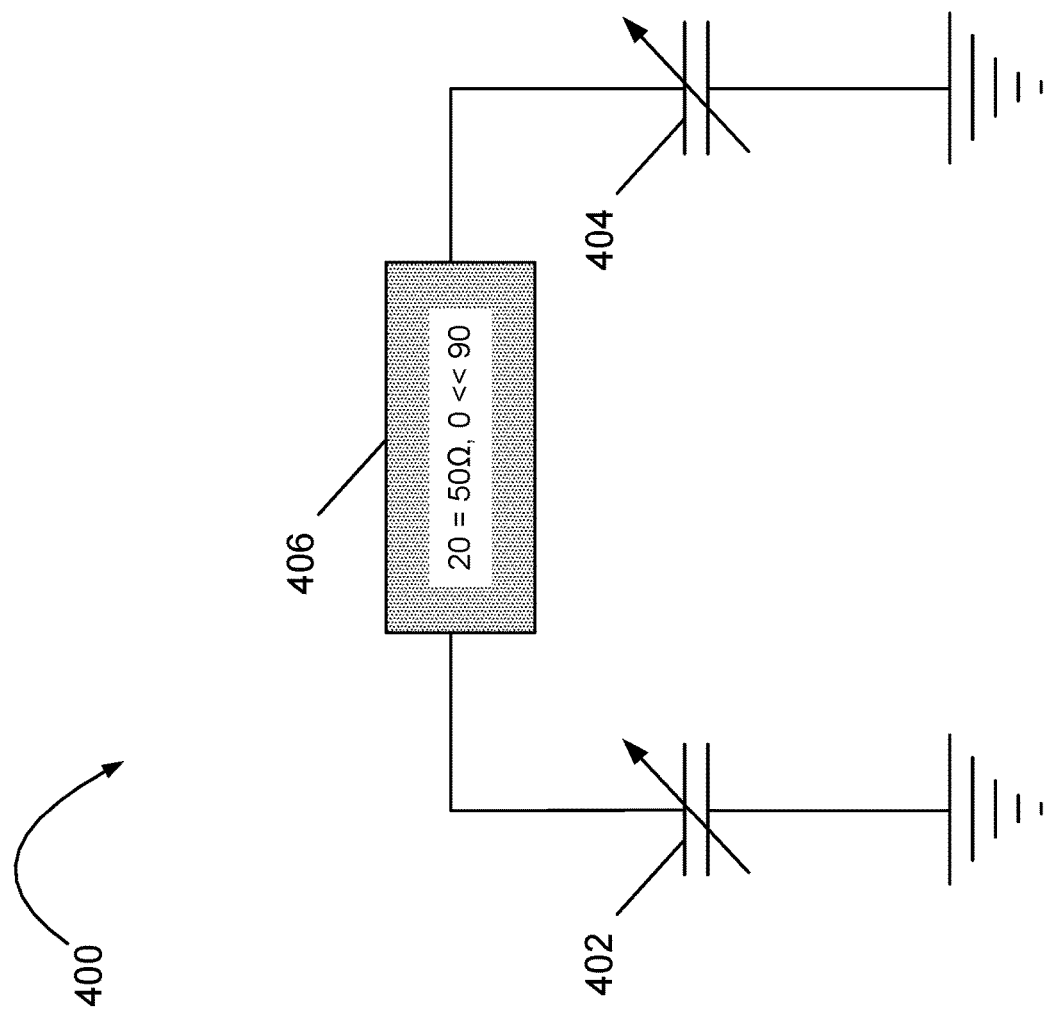
FIG. 4 is a schematic diagram for the $\lambda/4$ transmission line coupling the carrier PA to the peaking PA in the DPA of FIG. 1.

Attention is now directed at FIG. 4, which shows a schematic diagram for the $\lambda/4$ transmission line coupling the carrier PA 106 to peaking PA 108. The $\lambda/4$ transmission line 400 can be implemented to operate as the $\lambda/4$ transmission line 114 of FIG. 1 as an impedance transformer. Its design has two varactors 402-404 in parallel connected by a short transmission line 406. The varactors 402-404 provide phase shifts for the signals at the fundamental frequency and at the $2^{nd}$ harmonic.

Note that circuit 400 is a variable phase shift network that allows for phase adjustments needed in view of device parasitic effects at the peaking PA 108. These parasitic effects may prevent an accurate 180° phase shift needed at the PA 108 for the injection of the $2^{nd}$ harmonic signal. The varactors 402-404 mitigate this problem as they provide a variable reactance. Note also that due to the higher frequency at the $2^{nd}$ harmonic, the phase shift that can be achieved with the varactors 402-404 is higher as compared to the phase shift achieved at the fundamental frequency. The phase change at the fundamental frequency is therefore minimal compared to the one at the $2^{nd}$ harmonic.

Figure 5:
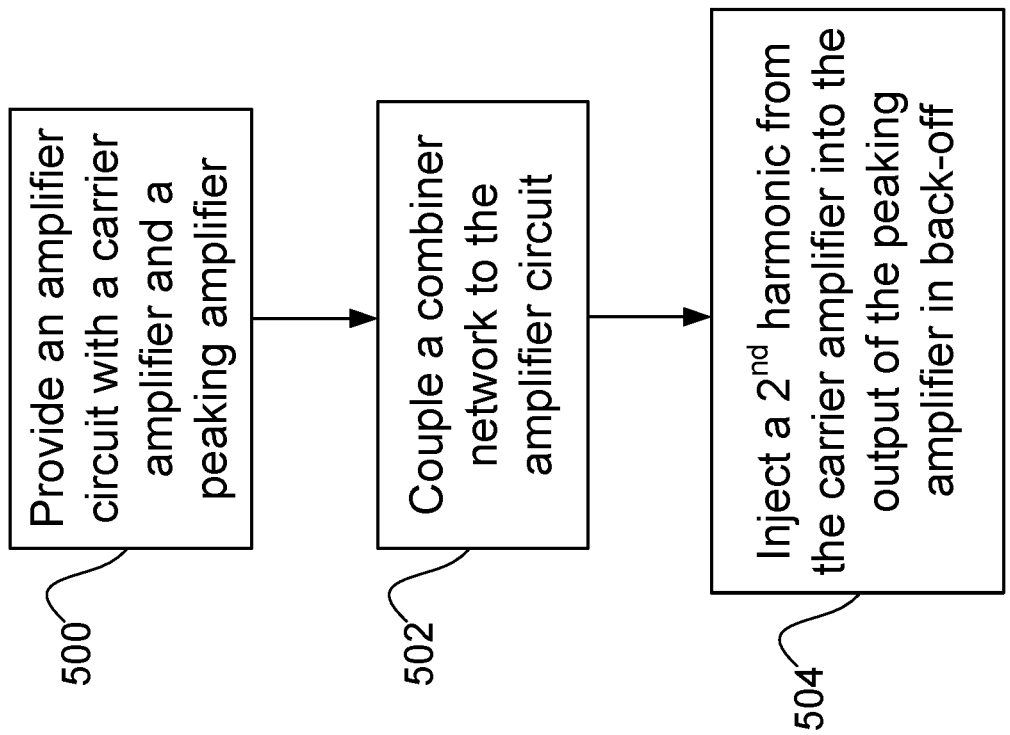
FIG. 5 is a flowchart for increasing the efficiency of a DPA in accordance with various examples.

A flowchart for increasing the efficiency of a DPA in accordance with various examples is shown on FIG. 5. First, an amplifier circuit is provided having a carrier amplifier and a peaking amplifier (500). The amplifier circuit includes a splitter to split an RF input signal into two signals that are 90° out of phase with each other. The splitter performs a 3-dB power split, with half the power of the input signal going to the carrier amplifier and the other half going to the peaking amplifier via a quarter of a wavelength transmission line. Next, a combiner network circuit is coupled to the amplifier circuit (502). The combiner network includes a $\lambda/4$ transmission line section and two 28 transmission line sections in parallel with a LC resonant circuit. Lastly, a $2^{nd}$ harmonic from the carrier amplifier is injected into the output of the peaking amplifier at back-off (504).

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A Doherty Power Amplifier ("DPA"), comprising:
an amplifier circuit comprising a first amplifier and a second amplifier; and
a combiner network coupled to the amplifier circuit and configured to inject a second harmonic from the first amplifier into the second amplifier, the combiner network comprising an impedance transformer with a first and a second varactor in parallel,
wherein the combiner network further comprises a $\lambda/4$ transmission line or a $\lambda/8$ transmission line in parallel with a resonant circuit.

2. The DPA of claim 1, wherein the amplifier circuit further comprises a splitter to split an RF input signal into a first and a second signal 90° out of phase, the first signal input into the first amplifier and the second signal input into the second amplifier.

3. The DPA of claim 1, wherein the combiner network comprises both the $\lambda/4$ transmission line and the $\lambda/8$ transmission line.

4. The DPA of claim 1, wherein the $\lambda/4$ transmission line is coupled to an output of the first amplifier to an output of the second amplifier.

5. A Doherty Power Amplifier ("DPA"), comprising:
an amplifier circuit comprising a first amplifier and a second amplifier; and
a combiner network coupled to the amplifier circuit and configured to inject a second harmonic from the first amplifier into the second amplifier, the combiner network comprising an impedance transformer with a first and a second varactor in parallel, wherein a resonant circuit comprises an open circuit at a fundamental frequency or a short circuit at the second harmonic.

6. The DPA of claim 5, wherein the second harmonic from the first amplifier is injected at an output of the second amplifier at back-off.

7. A combiner network, comprising:
a first $\lambda/4$ transmission line coupled to a first amplifier and a second amplifier;
a second $\lambda/4$ transmission line coupled between the second amplifier and a splitter, the splitter being coupled to the first amplifier and the second amplifier;

at least one λ/8 transmission line coupled to the first λ/4 transmission line; and a resonant circuit in parallel with the at least one λ/8 transmission line, wherein the resonant circuit comprises a series LC resonant circuit coupled to a parallel LC resonant circuit.

8. The combiner network of claim 7, wherein the splitter splits an RF input signal into a first and a second signal, the first signal input into the first amplifier and the second signal input into the second amplifier.

9. A combiner network, comprising:

a first λ/4 transmission line coupled to a first amplifier and a second amplifier;

a second λ/4 transmission line coupled between the second amplifier and a splitter, the splitter being coupled to the first amplifier and the second amplifier;

at least one λ/8 transmission line coupled to the first λ/4 transmission line; and a resonant circuit in parallel with the at least one λ/8 transmission line, wherein the resonant circuit comprises an open circuit at a fundamental frequency and a short circuit at the second harmonic.

10. The combiner network of claim 7, wherein one of the at least one λ/8 transmission line is coupled to a load.

11. The combiner network of claim 7, wherein the first λ/4 transmission line provides a 90° phase shift.

12. A combiner network, comprising:

a first λ/4 transmission line coupled to a first amplifier and a second amplifier;

a second λ/4 transmission line coupled between the second amplifier and a splitter, the splitter being coupled to the first amplifier and the second amplifier;

at least one λ/8 transmission line coupled to the first λ/4 transmission line; and a resonant circuit in parallel with the at least one λ/8 transmission line, wherein the first λ/4 transmission line or the at least one λ/8 transmission line comprises an impedance transformer with a first and a second varactor in parallel.

13. A method, comprising:

splitting an RF signal into a first signal and a second signal;

injecting the first signal to a first amplifier of an amplifier circuit;

injecting the second signal to a second amplifier of the amplifier circuit; and injecting a second harmonic from the first amplifier into the second amplifier via a combiner network coupled to the amplifier circuit, wherein the combiner network comprises a resonant circuit and at least one λ/8 transmission line in parallel with the resonant circuit.

14. The method of claim 13, wherein the second harmonic is injected into the second amplifier during an isolation from a load.

15. The method of claim 13, wherein the first signal and the second signal are 90° out of phase.

16. The method of claim 13, wherein the at least one λ/8 transmission line comprises an impedance transformer with a first and a second varactor in parallel.

17. The method of claim 13, wherein the combiner network further comprises a λ/4 transmission line coupled to the amplifier circuit and in parallel with the resonant circuit.

18. The method of claim 13, wherein the resonant circuit comprises a series LC resonant circuit coupled to a parallel LC resonant circuit.

* * * * *